United States Patent
Xu et al.

(10) Patent No.: US 12,076,973 B2
(45) Date of Patent: *Sep. 3, 2024

(54) BONDED SUBSTRATE INCLUDING POLYCRYSTALLINE DIAMOND FILM

(71) Applicant: II-VI Delaware, Inc., Wilmington, DE (US)

(72) Inventors: Wen-Qing Xu, Medfield, MA (US); Di Lan, Tampa, FL (US); Christopher Koeppen, New Hope, PA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/350,284

(22) Filed: Jul. 11, 2023

(65) Prior Publication Data

US 2024/0017524 A1 Jan. 18, 2024

Related U.S. Application Data

(63) Continuation of application No. 17/302,081, filed on Apr. 23, 2021, now Pat. No. 11,738,539, which is a (Continued)

(51) Int. Cl.
*B32B 9/00* (2006.01)
*B32B 37/18* (2006.01)
*B32B 38/00* (2006.01)

(52) U.S. Cl.
CPC ............ *B32B 9/007* (2013.01); *B32B 37/18* (2013.01); *B32B 38/0008* (2013.01);
(Continued)

(58) Field of Classification Search
CPC ..... B32B 9/007; B32B 37/18; B32B 38/0008; B32B 2038/0064; B32B 2310/14;
(Continued)

(56) References Cited

U.S. PATENT DOCUMENTS 7,842,134 B2 11/2010 Whitehead et al.
7,843,284 B2 11/2010 Ayazi et al.
(Continued)

FOREIGN PATENT DOCUMENTS

EP 2658122 A1 10/2013
JP 2003530705 A 10/2003
(Continued)

OTHER PUBLICATIONS

First Office Action in counterpart Korean Appl. 10-2020-0070691, dated Nov. 26, 2021, 13-pages.
(Continued)

*Primary Examiner* — Jeffrey M Shin
(74) *Attorney, Agent, or Firm* — Blank Rome LLP

(57) ABSTRACT

A wafer has a layer containing silicon, a layer of polycrystalline diamond deposited on the silicon-containing layer, and a bow-compensation layer on the other side of the silicon-containing layer for reducing wafer-bow. A method of making a bonded structure includes an activation process for creating dangling bonds on the surface of one substrate, followed by contact-bonding the surface to a second substrate at low temperature. A bonded structure may include two substrates contact bonded to each other, one substrate including a layer containing silicon, a layer of polycrystalline diamond, a bow-compensation layer for reducing wafer-bow of the first substrate, and the other substrate including gallium nitride, silicon carbide, lithium niobate, lithium tantalate, gallium arsenide, indium phosphide, or another suitable material other than diamond.

20 Claims, 5 Drawing Sheets

Related U.S. Application Data continuation-in-part of application No. 16/874,164, filed on May 14, 2020, now Pat. No. 11,362,640, and a continuation-in-part of application No. 16/037,499, filed on Jul. 17, 2018, now Pat. No. 11,121,696.

(60) Provisional application No. 63/014,163, filed on Apr. 23, 2020.

(52) U.S. Cl.
CPC ... *B32B 2038/0064* (2013.01); *B32B 2310/14* (2013.01); *B32B 2551/08* (2013.01)

(58) Field of Classification Search
CPC . B32B 2551/08; H01L 21/185; H01L 41/313; H03H 9/02574; H03H 9/02897
See application file for complete search history.

(56) References Cited

U.S. PATENT DOCUMENTS

| | | | |
|---|---|---|---|
| 9,337,799 | B2 | 5/2016 | Stephanou et al. |
| 10,164,601 | B2 | 12/2018 | Marksteiner |
| 10,320,361 | B2 | 6/2019 | Meltaus et al. |
| 11,121,696 | B2 | 9/2021 | Lan et al. |
| 11,218,132 | B2 | 1/2022 | Xu et al. |
| 11,362,640 | B2 | 6/2022 | Xu et al. |
| 11,652,465 | B2 | 5/2023 | Lan et al. |
| 11,738,539 | B2 * | 8/2023 | Xu .................. B32B 9/007 310/346 |
| 2006/0113545 | A1 | 6/2006 | Weber et al. |
| 2007/0296521 | A1 | 12/2007 | Schmidhammer |
| 2008/0079515 | A1 | 4/2008 | Ayazi et al. |
| 2009/0096550 | A1 | 4/2009 | Handtmann et al. |
| 2009/0142480 | A1 | 6/2009 | Godshalk et al. |
| 2009/0142485 | A1 | 6/2009 | Lai et al. |
| 2013/0099630 | A1 | 4/2013 | Matsuda et al. |
| 2014/0117815 | A1 | 5/2014 | Bi et al. |
| 2014/0118087 | A1 | 5/2014 | Burak et al. |
| 2014/0125432 | A1 | 5/2014 | Stephanou et al. |
| 2014/0152146 | A1 | 6/2014 | Kimura et al. |
| 2015/0263697 | A1 | 9/2015 | Zhang et al. |
| 2015/0357375 | A1 | 12/2015 | Tsai et al. |
| 2016/0182007 | A1 | 6/2016 | Bhattacharjee |
| 2016/0186362 | A1 | 6/2016 | Mollart et al. |
| 2016/0365842 | A1 | 12/2016 | Marksteiner |
| 2017/0033769 | A1 | 2/2017 | Yokoyama |
| 2017/0034358 | A1 | 2/2017 | Bianco et al. |
| 2017/0117872 | A1 | 4/2017 | Morton et al. |
| 2020/0287514 | A1 | 9/2020 | Xu et al. |

FOREIGN PATENT DOCUMENTS

| | | |
|---|---|---|
| JP | 2006246451 A | 9/2006 |
| JP | 2008504756 A | 2/2008 |
| JP | 2008301453 A | 12/2008 |
| JP | 2013528996 A | 7/2013 |
| JP | 2014171218 A | 9/2014 |
| JP | 2016127585 A | 7/2016 |
| JP | 2017034358 A | 2/2017 |
| JP | 2017509246 A | 3/2017 |
| WO | 0178230 A1 | 10/2001 |
| WO | 2017070177 A1 | 4/2017 |

OTHER PUBLICATIONS

Office Action in counterpart Japan APPi. 2019-131179, mailed Jun. 16, 2020, 8 pages.
Office Action in counterpart Taiwan Appl. 108124948, mailed Jul. 27, 2020, 10 paaes.
Office Action issued in Japanese Patent Application No. 2020097677 mailed on Aug. 24, X 2021 and the Enalish translation, 24 pages.
"Office Action in counterpart Japan Appl. 2019-131179, mailed Jun. 16, 2020, 8 pages".
"Office Action in counterpart Taiwan Appl. 108124948, mailed Jul. 27, 2020, 10 pages".

* cited by examiner

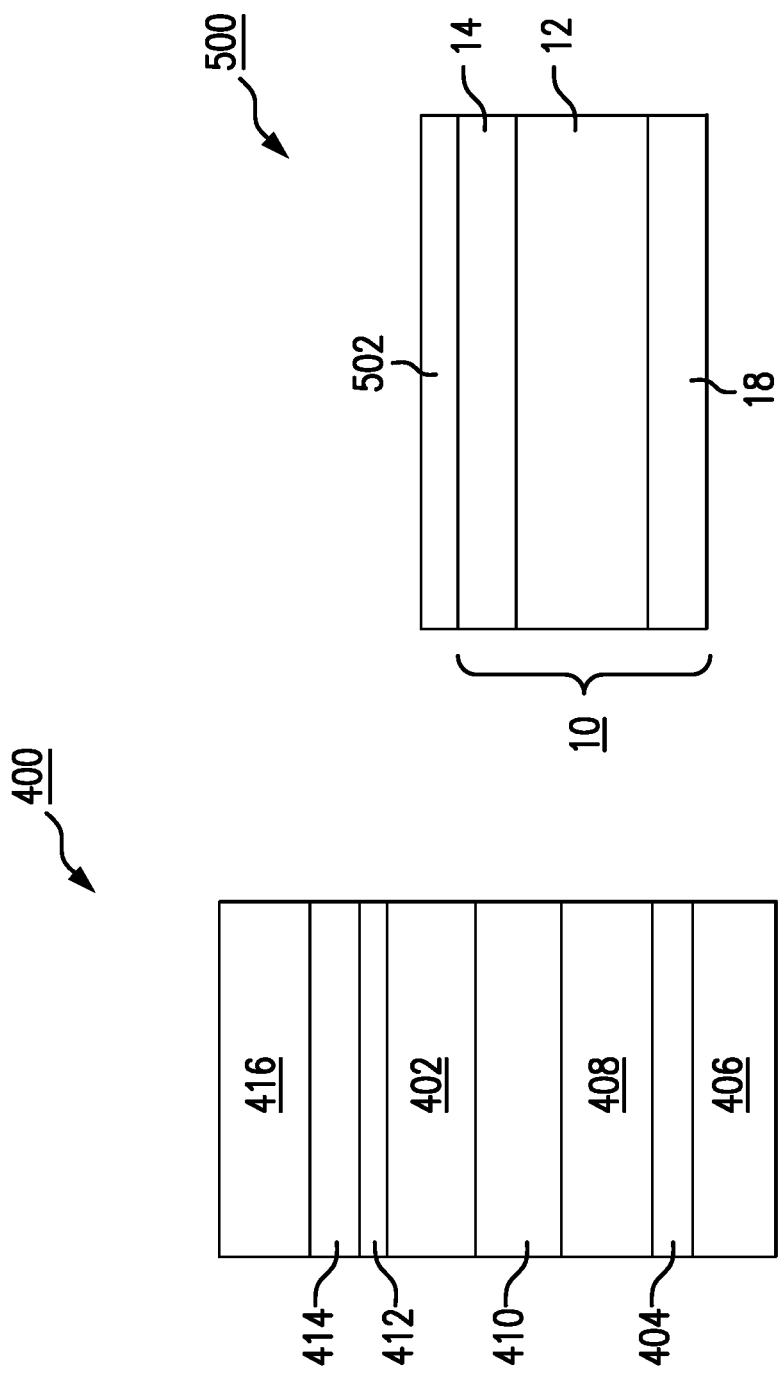

BONDED SUBSTRATE INCLUDING POLYCRYSTALLINE DIAMOND FILM

CROSS-REFERENCE TO RELATED APPLICATION

This application is a continuation of Ser. No. 17/302,081, filed Apr. 23, 2021, which claims priority to U.S. Provisional Patent Application No. 63/014,163, filed Apr. 23, 2020. The present application is a continuation-in-part of U.S. patent application Ser. Nos. 16/874,164 and 16/037,499, filed May 14, 2020, and Jul. 17, 2018, respectively. The entire disclosures of U.S. Provisional Patent Application No. 63/014,163 and U.S. patent application Ser. Nos. 16/874,164 and 16/037,499 are incorporated herein by reference.

SUMMARY OF DISCLOSURE

The present disclosure relates to a wafer which includes a layer containing silicon, a layer of polycrystalline diamond deposited on the silicon-containing layer, and a bow-compensation layer, for reducing wafer-bow, located on the other side of the silicon-containing layer. The wafer-bow that is reduced or eliminated can be induced by a mis-match between the coefficients of thermal expansion of the respective materials of the layer containing silicon and the layer of polycrystalline diamond.

According to a preferred embodiment, the wafer-bow (defined below) may be less than 50 microns. According to other preferred embodiments, one or more layers may be formed on or above the polycrystalline diamond layer, such as a polished layer of a deposited material other than polycrystalline diamond, and/or deposited acoustic mirror layers having alternating low and high acoustic impedances.

The present disclosure also relates to a method of making a bonded structure, including performing an activation process on a surface of a first substrate, to create dangling bonds on at least that surface, and then contact bonding the surface of the first substrate to a surface of a second substrate. The activation process may be, for example, a plasma activation process. The bonding may be performed at room temperature, or the bonded structure may be thermally annealed at a low temperature.

According to a preferred embodiment, a material other than diamond is deposited on a layer of polycrystalline diamond, and then the surface roughness of the material other than diamond is reduced. This approach may be especially helpful where it is difficult to polish the polycrystalline diamond layer to a surface roughness suitable for contact bonding. If desired, the surface roughness of the material other than diamond is reduced by chemical-mechanical polishing, ion milling, and/or magnetorheological finishing.

According to another preferred embodiment, to create desired dangling bonds for a chemical bond between the two substrates, a water treatment process may be performed on at least the surface of the first substrate. The dangling bonds promote chemical activity similarly to how free radicals promote chemical activity. Contact bonding of the substrates may be initially established by Van der Waals forces. The water may be provided by a suitable source such as a megasonic cleaning process, or environmental moisture.

The present disclosure also relates to a bonded structure including first and second substrates, where the first substrate includes a layer containing silicon, a layer of polycrystalline diamond, a bow-compensation layer for reducing wafer-bow of the first substrate, and a bonding surface, and the second substrate includes gallium nitride, silicon carbide, lithium niobate, lithium tantalate, gallium arsenide, indium phosphide, or another suitable material, and a bonding surface, and where the bonding surfaces of the two substrates are contact bonded to each other.

According to a preferred embodiment, the second substrate includes a removable carrier layer which may be used to handle the second substrate before the two substrates are bonded to each other.

BRIEF DESCRIPTION OF THE DRAWINGS

FIG. 5 is a cross-sectional view of a layered structure, not containing diamond, constructed in accordance with the present disclosure;

FIG. 6 is a cross-sectional view of yet another wafer structure constructed in accordance with the present disclosure;

DETAILED DESCRIPTION

Figure 1:
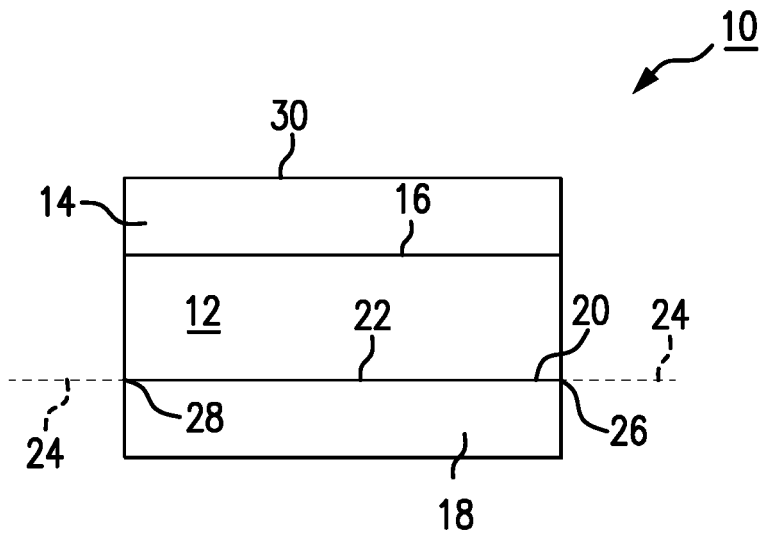
FIG. 1 is a cross-sectional view of a wafer structure constructed in accordance with the present disclosure.

Referring now to the drawings, where like elements are designated by like reference numerals, there is shown in FIG. 1 an example of a wafer structure 10 constructed in accordance with the present disclosure. The wafer structure 10 includes a wafer 12 which contains silicon (Si), a diamond layer 14 deposited on the front side 16 of the wafer 12, formed of polycrystalline diamond, and a bow-compensation layer 18 deposited on the back side 20 of the wafer 12. If desired, the wafer 12 may be formed of elemental silicon. The bow-compensation layer 18 may be a film or layer of high compression-strength material.

A mis-match between the coefficients of thermal expansion (CTE) of the materials of the silicon-containing wafer 12 and the diamond layer 14 tends to induce an undesirable wafer-bow within the wafer structure 10. The bow compensation layer 18 prevents or at least reduces the extent of such wafer-bow by providing wafer back-side compensation. The bow-compensation layer 18 may be a film of high compression-strength material such as aluminum nitride (AlN), silicon nitride (SiN), or some other suitable dielectric material. Alternatively, the bow-compensation layer 18 may include high compression-strength metal or some other high compression-strength material.

The term "wafer-bow," as used herein, means the extent to which a central portion 22 of the back side 20 of the wafer 12 is deflected upwardly (as viewed in FIG. 1) from a corresponding central portion of a plane 24 which extends through the back-side edges 26, 28 of the wafer 12. In other words, the term "wafer-bow," as used herein, means the distance between (A) the back-side central portion 22 of the wafer 12 and (B) the plane 24, in a direction normal to the plane 24. If desired, the wafer structure 10 may have a wafer-bow of <50 μm, more preferably <35 μm, even more preferably <25 μm, and even more preferably <15 μm.

In the example illustrated in FIG. 1, the diamond layer 14 is formed by depositing or bonding polycrystalline diamond on or to the front side 16 of the wafer 12, and then polishing the front side 30 of the diamond layer 14. If the surface roughness of the diamond-layer front-side 30 is too rough for surface bonding despite such polishing, then one or more foreign materials may be deposited on the diamond-layer front-side 30 and polished to a surface roughness that is low enough and suitable for wafer bonding.

The one or more foreign materials deposited on the diamond-layer front-side 30 may include, for example, a dielectric material such as silicon dioxide ($SiO_2$), a metallic layer, or a semiconductor layer such as silicon (Si). Chemical-mechanical polishing (CMP) may be performed on the one or more foreign materials to provide a surface roughness that is low enough and suitable for wafer bonding. If the chemical-mechanical polishing results in undesirable within-wafer-non-uniformity (WWNU), then the polishing may be supplemented or replaced by magnetorheological finishing (MRF) or ion milling.

According to one aspect of the present disclosure, the chemical-mechanical polishing process is optional. If desired, the one or more foreign materials may be deposited on or otherwise applied to the diamond-layer front-side 30 with a sufficiently smooth surface according to a process which does not require chemical-mechanical polishing. For example, a $SiO_2$ layer may be deposited on or otherwise applied to the diamond-layer front-side 30 with a sufficiently smooth surface such that chemical-mechanical polishing of the $SiO_2$ layer is not required. According to another embodiment of the present disclosure, for example, a spin-on-glass process may be applied on the diamond layer to provide a sufficiently smooth surface for a desired bonding process such that chemical-mechanical polishing is not required.

A suitable process for forming the wafer structure 10 may be as follows: Polycrystalline diamond is grown on the front side 16 of the silicon-containing wafer 12 (an example of a substrate) to produce the diamond layer 14 (but with a rough surface). Then, the rough surface of the diamond layer 14 is polished to a mirror surface finish along with other processing steps to achieve desired wafer specifications. Then, a compensation process is performed by depositing a layer 18 of aluminum nitride on the back side 20 of the wafer 12 so that bowing caused by a mis-match between the coefficients of thermal expansion of the wafer 12 and the polycrystalline diamond layer 14 is prevented or at least reduced.

Figure 2:
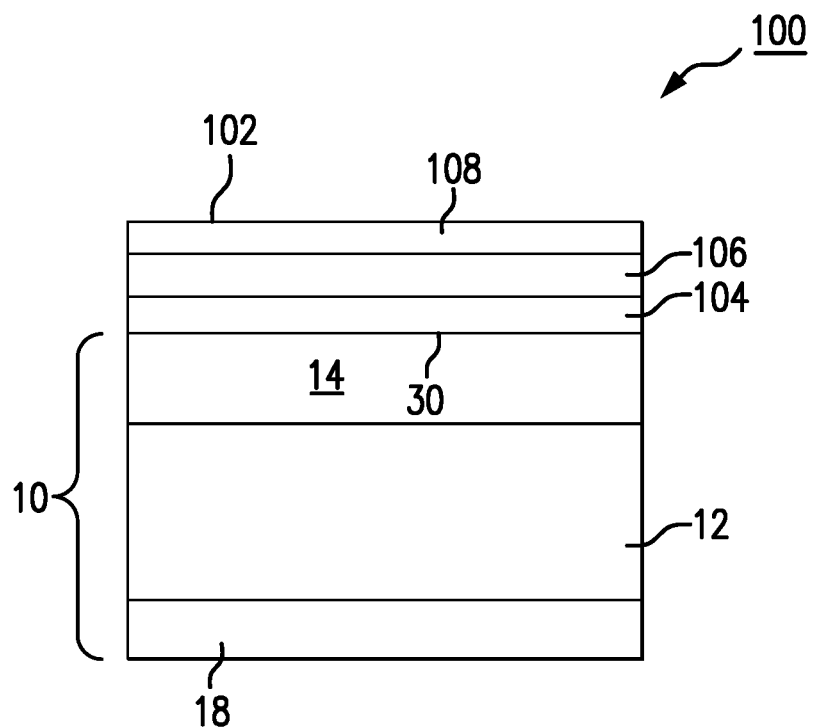
FIG. 2 is a cross-sectional view of another wafer structure constructed in accordance with the present disclosure.

FIG. 2 shows a wafer structure 100 which has a suitably low surface roughness on a front side 102. The wafer structure 100 includes a stack of acoustic mirror layers 104, 106, 108, in order, on the diamond-layer front-side 30 of the wafer structure 10 of FIG. 1. The first layer 104 may include $SiO_2$. The second layer 106 may include W, AlN, or SiC. The third layer 108 may include $SiO_2$ or Si. The wafer structure 100 may be produced by depositing the acoustic mirror layers 104, 106, 108 or other combinations of low acoustic/high acoustic materials, or by alternatingly depositing, in the same order or in different orders, low acoustic impedance and high acoustic impedance layers to construct an effective acoustic mirror for reflecting an acoustic wave. Additional layers (not shown), similar to the illustrated layers 104, 106, 108, may be deposited on the wafer structure 10 in a repeating pattern, if desired, to obtain desired physical, acoustic, thermal, or other benefits and characteristics.

If desired, the top-most layer 108 of the wafer structure 100 may be tens of microns thick, or less than ten microns thick, or less than one micron thick. The top-most layer 108 may be, for example, a layer of about 1.5 μm of low acoustic impedance material ($SiO_2$ or Si, preferably amorphous silicon). The surface 102 of the top-most layer 108 may be chemically-mechanically polished to achieve a desirable surface roughness which may be Ra≤2 nm, or more preferably ≤1 nm. If the polished surface 102 has unacceptable within-wafer-non-uniformity, then ion-trimming or magnetorheological finishing may be employed to further reduce the $SiO_2$/Si top-most layer 108 to a uniform thickness.

In an alternative embodiment, at least a transition layer (not shown) may be deposited on the wafer structure 10 to achieve acceptable surface roughness.

The process for preparing a bonded substrate including a layer of polycrystalline diamond material, to produce the device 100 illustrated in FIG. 2, may include surface preparation for achieving a desirable low surface roughness for wafer-to-wafer bonding, as follows: First, at least one layer 108 of foreign material is deposited on the front-side 30 of the polycrystalline diamond layer 14. The foreign material which is used to achieve a desirable low surface roughness may be one or more of a variety of different materials or devices, including, but not limited to, a dielectric material, a metallic material, or a semiconductor material such as PECVD silicon dioxide. Then, the surface 102 of the foreign material is polished to a surface roughness that is suitable for wafer-to-wafer bonding. Then, as an optional step, the polished foreign layer 108 is reduced to a uniform, desirable thickness by a suitable method such as ion-milling or magnetorheological finishing.

Figure 3:
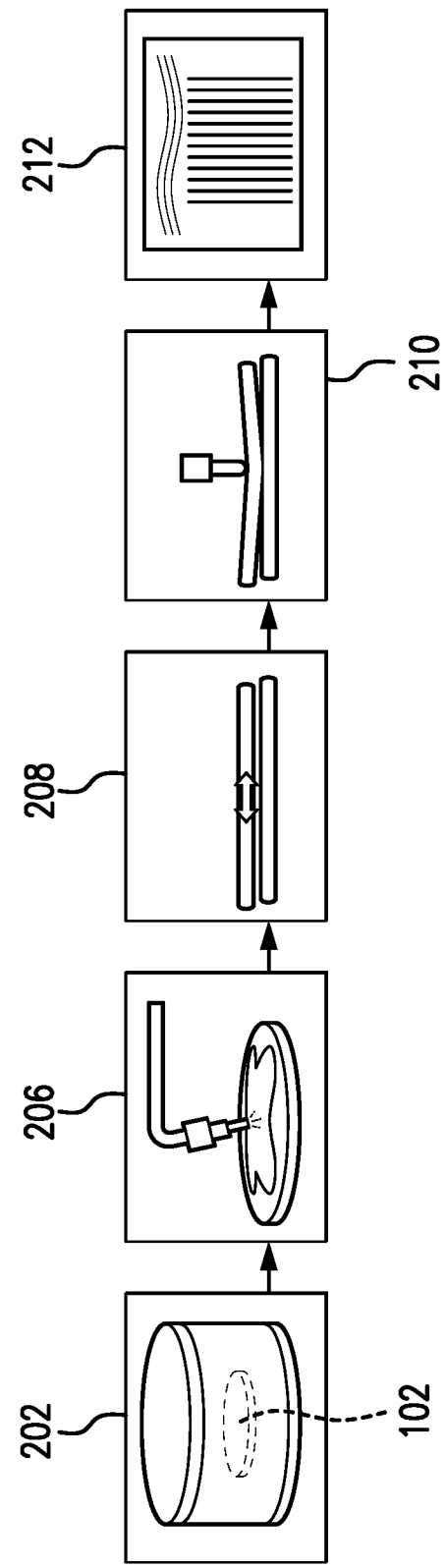
FIG. 3 is a schematic illustration of a method of bonding first and second wafer structures to each other.

The process illustrated in FIG. 3 may be used to bond one or more layers including gallium nitride (GaN), silicon carbide (SiC), lithium niobate (LiNbO3), lithium tantalate (LiTaO3), or another suitable material to a layered structure 100 which includes polycrystalline diamond, where the bonding occurs at low temperature (for example, at a bonding temperature <250° C.). First, in a plasma activation step 202, the surface 102 of the top-most layer 108 of the wafer structure 100 is activated by a plasma to create dangling bonds on the wafer surface 102. The plasma may contain nitrogen, oxygen, chemically active gas, or an inert gas. If desired, a surface of another substrate may also be activated using a similar or suitable surface-activation process.

If desired, according to other embodiments of the present disclosure, the surface activation processes described herein may be used in connection with materials other than diamond. In general, one or more of the activation processes may be used to facilitate contact bonding of substrates neither of which contain diamond.

Then, in an optional water treatment step 206, the plasma-activated surface 102 is further activated by water which may be provided by a megasonic cleaning process, or by moisture in the environment. If desired, the surfaces of the two substrates to be bonded together may be activated by water or by moisture in the air.

Then, during an optional alignment step 208, the wafers are aligned as desired. Then, during a bonding step 210, the wafers are contact-bonded to each other to establish a bond therebetween by, for example, Van der Waals forces, and then, during an annealing step 212, the bonded wafers are thermally annealed at low temperature. The annealing temperature may be, for example, ≤300° C., or ≤450° C., or ≤600° C. The bonded structure may then be further processed into a desired device, which may be a passive device or an active device.

According to another aspect of the present disclosure, to accomplish low temperature, or room temperature, waferto-wafer bonding, the surface 102 of the substrate containing diamond may be activated by fast atom beam (FAB) processing under vacuum. The desired activation produces dangling bonds on the activated surface. The surface of the other substrate (the one that does not include diamond) may be activated by a similar process. After one or both of the surfaces are activated, they may be aligned under high vacuum, and then bonded to each other. The bonding process may optionally be performed under pressure.

If it is desired to bond a layer of GaN, SiC, LiNbO$_3$, or LiTaO$_3$ to a substrate that includes diamond, then the bonding process may be performed at an even lower temperature, such as room temperature. The wafer surface preparation for a room-temperature bonding process may be the same as that for the low-temperature process; however, if desired, the wafer surface may be activated by fast atom beam processing, and the bonding pressure may be <1.0×10$^{-5}$ Pa.

Figure 4:
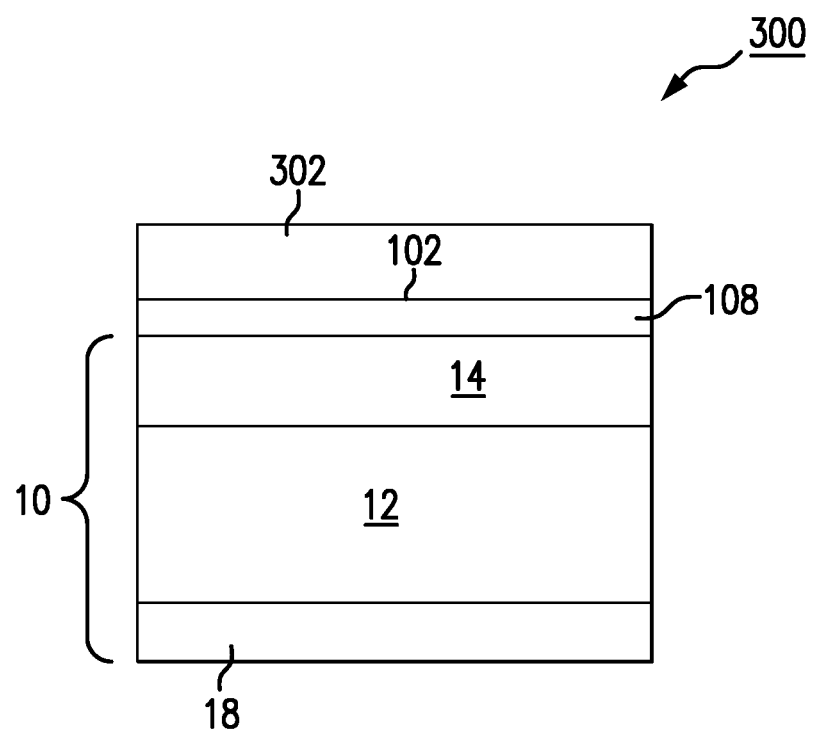
FIG. 4 is a cross-sectional view of a bonded structure constructed in accordance with the present disclosure.

FIG. 4 shows another example of a wafer structure constructed in accordance with the present disclosure, where a substrate 300 includes a polycrystalline diamond layer 14 and a lithium niobate (LiNbO$_3$) layer 302. The substrate 300 shown in FIG. 4 includes the wafer structure 10 shown in FIG. 1. As illustrated in FIG. 4, the polished front side 102 of a layer 108 of SiO$_2$ deposited on the diamond layer 14 may be bonded to the layer 302 of lithium niobate. If desired, the thickness of the SiO$_2$ layer 108 may be reduced to less than 2 microns, more preferably to less than 1 micron, before the lithium niobate layer 302 is bonded to the SiO$_2$ layer 108.

FIG. 5 shows an example of a layered structure 400 that contains a channel layer 402 of gallium nitride (GaN) epitaxially deposited on an epitaxially deposited substrate. Although the layer 402 includes gallium nitride in the illustrated example, the epitaxially deposited layer 402 may alternatively include silicon carbide, lithium niobate, lithium tantalate, or another suitable material. The illustrated structure 400 has an aluminum nitride (AlN) nucleation layer 404 deposited on a silicon or silicon carbide substrate 406. An AlGaN transition layer 408 is deposited on the nucleation layer 404. A GaN buffer layer 410 is deposited on the transition layer 408, and the GaN layer 402 is deposited on the buffer layer 410.

A barrier 412, which may be formed of AlGaN, is deposited on the GaN channel layer 402, and then a SiN passivation layer 414 may be deposited on the barrier 412. A carrier substrate 416 may be deposited on or bonded to the passivation layer 414, and then the Si or SiC substrate 406 may be removed. If desired, the nucleation layer 404, the transition layer 408, and/or part of, or all of, the buffer layer 410 may be removed along with or after the removal of the Si or SiC substrate 406.

FIG. 6 illustrates a layered structure 500 which includes diamond and which is adapted to be bonded to the GaN-containing layered structure 400 (FIG. 5). The layered structure 500 of FIG. 6 has a top-most film 502 that includes aluminum nitride. The layered structure 500 is prepared by depositing the aluminum nitride film 502 on the surface of the polycrystalline diamond layer 14. The deposited film 502 may alternatively be a dielectric layer, a metallic layer, or a semiconductor layer. The deposited film 502 may be subjected to chemical-mechanical polishing, ion trimming, and/or magnetorheological finishing to achieve a desired low surface roughness which may be, for example, Ra≤1 nm. The thickness of the aluminum nitride layer 502, after polishing, that is, as illustrated in FIG. 6, may be in the range of from 40 nm to 50 nm.

Figure 7:
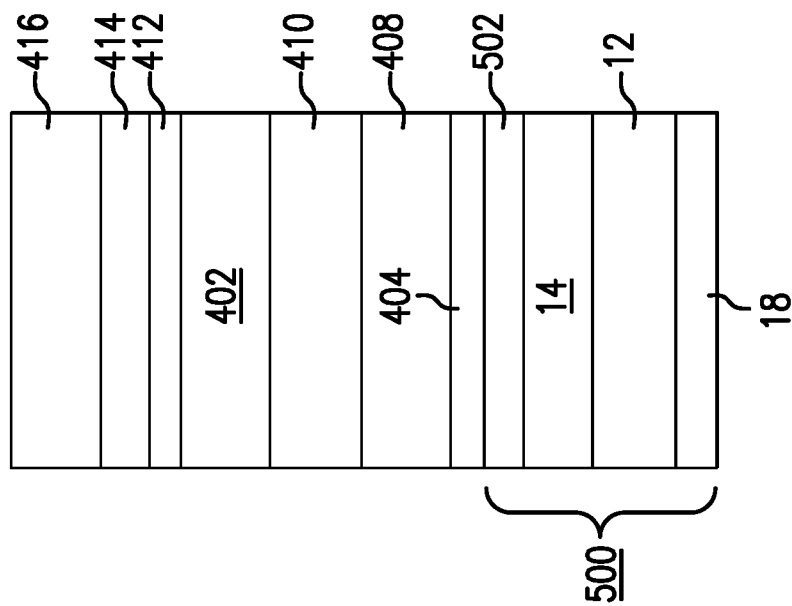
FIG. 7 is cross-sectional view of a bonded structure including the layered and wafer structures of FIGS. 5 and 6.

FIG. 7 shows the result of bonding the layered structures of FIGS. 5 and 6. The bonding may be performed using the room temperature process described above after activation by fast atom beam processing. The present disclosure is not limited, however, to the examples described herein. Thus, the process may be used not only to bond a layered structure containing gallium nitride to a layered structure containing diamond deposited on a silicon wafer, but also to bond a layered structure containing silicon carbide, lithium niobate, lithium tantalate, or another suitable material to a layered structure containing diamond deposited on a silicon wafer. Also, the nucleation, transition, and buffer layers 404, 408, 410 shown in FIGS. 5 and 7 may be removed for improved physical, thermal, electrical, or electromagnetic benefits. The carrier substrate 416 may be used to handle the layered structure 400 before the layered structure 400 is bonded to the layered structure 500 (FIG. 6). After the bonding process, the carrier substrate 416 may be removed (FIG. 8).

Figure 8:
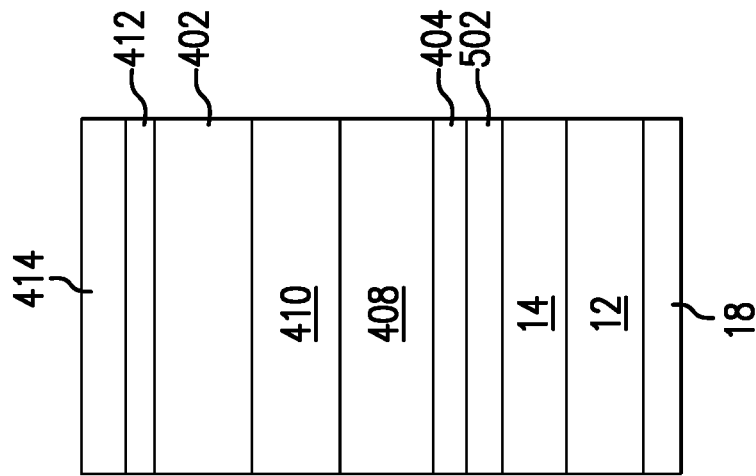
FIG. 8 is a cross-sectional view of the bonded structure of FIG. 7 at a subsequent stage of production.

In the example illustrated in FIG. 8, the bonded structure includes a bow-compensation layer 18. However, according to other preferred embodiments of the present disclosure, if the substrates being bonded do not induce a large amount of wafer-bow, because, for example, the substrates are sufficiently small, or for some other reason, then the bow-compensation layer 18 may not be included.

The present disclosure provides a method for bonding a first substrate (such as a wafer) to a second substrate (such as another wafer) at a low temperature or at an even-lower room temperature. The first substrate may contain a layer of polycrystalline diamond deposited on silicon. The second substrate may contain gallium nitride, silicon nitride, lithium niobate, lithium tantalate, and/or another suitable material. Low-temperature or room-temperature bonding of such substrates may be especially advantageous where it is desired to overcome a mis-match between the coefficients of thermal expansion of diamond, silicon, lithium niobate, lithium tantalate, and other related materials that may be in a stack of deposited or bonded materials.

According to the present disclosure, wafer-to-wafer bonding at low temperature may be achieved by performing a surface activation process on one or more of the wafer surfaces by a plasma of N$_2$, O$_2$, and/or an inert gas, to create dangling bonds on the activated surface(s), following by bonding of the surfaces to each other. If desired, the surfaces may be further activated after the plasma activation, and before bonding, by atmospheric moisture or cleaning water.

Wafer-to-wafer bonding at room temperature may be achieved by performing a surface activation process on one or more of the wafer surfaces by fast atom beam activation or ion beam milling, to create dangling bonds on the activated surface(s), followed by bonding the surfaces to each other under vacuum and at room temperature. If desired, the activation process may be supplemented or replaced by a chemical activation process which employs a suitable material for achieving activation of the surface(s) of one or more of the substrates to be bonded, where the suitable material is an oxidizing agent, an acid, a base, etc.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A wafer comprising:
a layer containing silicon;
a layer of polycrystalline diamond deposited on the layer containing silicon;
acoustic mirror layers deposited on the layer of polycrystalline diamond; and
a bow-compensation layer for reducing wafer-bow of the layer containing silicon and the layer of polycrystalline diamond;
wherein the layer containing silicon is located between the layer of polycrystalline diamond and the bow-compensation layer.

2. The wafer of claim 1, wherein the wafer-bow is less than 50 microns.

3. The wafer of claim 1, further comprising a polished layer of material other than polycrystalline diamond, wherein the layer of polycrystalline diamond is located between the polished layer and the layer containing silicon.

4. The wafer of claim 1, wherein the acoustic mirror layers have alternating low acoustic and high acoustic impedances.

5. A method of making a bonded structure comprising:
performing a plasma activation process creating dangling bonds on a first surface of a first substrate; and
contact bonding the first surface of the first substrate to a second surface of a second substrate to form the bonded structure.

6. The method of claim 5, further comprising forming the first substrate by depositing a material other than diamond on a layer of polycrystalline diamond, and then reducing surface roughness of the material other than diamond.

7. The method of claim 6, wherein the surface roughness of the material other than diamond is reduced by one of chemical-mechanical polishing, ion milling, and magneto-rheological finishing.

8. The method of claim 5, wherein plasma for the plasma activation process includes nitrogen, oxygen, a chemically active gas, or an inert gas.

9. The method of claim 8, further comprising performing a plasma activation process on the second surface of the second substrate to create dangling bonds on the second surface of the second substrate.

10. The method of claim 5, further comprising performing a water treatment process on the first surface of the first substrate.

11. The method of claim 10, wherein the water treatment process includes a megasonic cleaning process.

12. The method of claim 5, further comprising aligning the first substrate and the second substrate before the contact bonding.

13. The method of claim 5, wherein bonding of the first surface of the first substrate to the second surface of the second substrate to form the bonded structure is achieved by Van der Waals forces between the first surface of the first substrate and the second surface of the second substrate.

14. The method of claim 13, wherein the contact bonding of the first surface of the first substrate to the second surface of the second substrate is performed at room temperature.

15. The method of claim 13, wherein the bonded structure is thermally annealed at a low temperature, and wherein the low temperature is ≤ 300° C.

16. A bonded structure comprising:
a first substrate including a layer containing silicon, a layer of polycrystalline diamond, a bow-compensation layer for reducing wafer-bow of the first substrate, and a first bonding surface; and
a second substrate including a second bonding surface,
wherein the first bonding surface of the first substrate includes dangling bonds that are contact-bonded to the second bonding surface of the second substrate.

17. The bonded structure of claim 16,
wherein the second substrate includes a removable carrier substrate, and
wherein the second substrate includes one of gallium nitride, silicon carbide, lithium niobate, lithium tantalate, gallium arsenide, and indium phosphide, and is located between the removable carrier substrate and the second bonding surface of the second substrate.

18. The bonded structure of claim 16,
wherein the first substrate includes an aluminum nitride layer, the second substrate includes an aluminum nitride nucleation layer, and
wherein the aluminum nitride layer and the aluminum nitride nucleation layer include the first bonding surface of the first substrate and the second bonding surface of the second substrate.

19. The bonded structure of claim 16, wherein the second bonding surface of the second substrate includes dangling bonds.

20. The bonded structure of claim 16, further comprising acoustic mirror layers deposited on the layer of polycrystalline diamond.

* * * * *